United States Patent
Lim (10) Patent No.: US 11,812,596 B2
(45) Date of Patent: Nov. 7, 2023

(54) COMPLEX DEVICE

(71) Applicant: AMOTECH CO., LTD., Incheon (KR)

(72) Inventor: Byung guk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 17/754,939

(22) PCT Filed: Sep. 17, 2020

(86) PCT No.: PCT/KR2020/012537
§ 371 (c)(1),
(2) Date: Apr. 15, 2022

(87) PCT Pub. No.: WO2021/075738
PCT Pub. Date: Apr. 22, 2021

(65) Prior Publication Data
US 2022/0394891 A1    Dec. 8, 2022

(30) Foreign Application Priority Data
Oct. 18, 2019   (KR) ................... 10-2019-0129779

(51) Int. Cl.
*H01C 7/12* (2006.01)
*H05K 9/00* (2006.01)
(Continued)

(52) U.S. Cl.
CPC ......... *H05K 9/0067* (2013.01); *H01C 7/1006* (2013.01); *H01C 7/12* (2013.01); *H01G 4/40* (2013.01)

(58) Field of Classification Search
CPC .......... H05K 9/00; H05K 9/0067; H01C 7/12; H01C 7/10; H01G 4/40; H01G 4/1209; H01G 4/20
(Continued)

(56) References Cited

U.S. PATENT DOCUMENTS

| | | |
|---|---|---|
| 9,293,913 B2 | 3/2016 | Umeda et al. |
| 2015/0189727 A1* | 7/2015 | Shibayama ............... H05F 3/04 361/220 |
| 2019/0287728 A1* | 9/2019 | Cho ......................... H01G 4/01 |

FOREIGN PATENT DOCUMENTS

| | | |
|---|---|---|
| KR | 10-2015-0135909 A | 12/2015 |
| KR | 10-1751825 B1 | 7/2017 |

(Continued)

OTHER PUBLICATIONS

International Search Report for PCT/KR2020/012537 from Korean Intellectual Property Office dated Dec. 24, 2020.

*Primary Examiner* — Danny Nguyen
(74) *Attorney, Agent, or Firm* — BROADVIEW IP LAW, PC (57) ABSTRACT

A complex device is provided. A complex device according to an embodiment of the present invention comprises: a suppressor including a pair of first dielectric sheet layers having a first dielectric constant and a pair of internal electrodes spaced apart from each other on one surface of one of the pair of first dielectric sheet layers; a capacitor including a plurality of second dielectric sheet layers having a second dielectric constant and a plurality of capacitor electrodes provided on each of the plurality of second dielectric sheet layers; and a pair of external terminals provided on both sides of the suppressor and the capacitor to be connected to the plurality of capacitor electrodes and the pair of internal electrodes. Here, provided is the complex device in which the first dielectric constant is greater than the second dielectric constant.

9 Claims, 8 Drawing Sheets

(51) Int. Cl.
*H01G 4/40* (2006.01)
*H01C 7/10* (2006.01)

(58) Field of Classification Search
USPC .................................................. 361/117–120
See application file for complete search history.

(56) References Cited

FOREIGN PATENT DOCUMENTS

| | | |
|---|---|---|
| KR | 10-1760877 B1 | 7/2017 |
| KR | 10-2019-0001951 A | 1/2019 |
| KR | 10-2019-0008147 A | 1/2019 |

* cited by examiner

| Classification | ESD path | | |
| --- | --- | --- | --- |
| | +4kV | +6kV | +8kV |
| Comparative Example 5 | Heterojunction 100% | Heterojunction 100% | Heterojunction 80% |
| Comparative Example 6 | Heterojunction 100% | Heterojunction 100% | Heterojunction 80% |

FIG. 12

COMPLEX DEVICE

CROSS-REFERENCE TO RELATED APPLICATIONS

This application is a National Phase Entry Application of PCT Application No. PCT/KR2020/012537 filed on Sep. 17, 2020, which claims priority to Korean Patent Application No. 10-2019-0129779 filed on Oct. 18, 2019 in Korean Intellectual Property Office, the entire contents of which is hereby incorporated by reference in its entirety.

TECHNICAL FIELD

The present invention relates to a complex device for an electronic apparatus, such as a smart phone, capable of quickly realizing a response speed to static electricity while satisfying RF characteristics.

BACKGROUND

Recently, as metal housings are common in portable electronic devices, electric shock protection functions and static electricity protection functions are required. Also, it is essential to perform a communication function due to the characteristics of the portable electronic device.

To this end, emerging is a complex device in which a suppressor or varistor having an electric shock and static electricity protection functions and a capacitor having a communication function are combined.

However, in a conventional complex device, since the suppressor or varistor and the capacitor are composed of the same dielectric sheet layer, depending on the part installed in the portable electronic device, a specific function among the communication function and the protection function has excellent characteristics. Therefore, there is an urgent need to develop a complex device having excellent communication function and high response speed to static electricity.

The above information disclosed in this Background section is only for enhancement of understanding of the background of the invention and it may therefore contain information that does not form the prior art that is already known to a person of ordinary skill in the art.

SUMMARY

Technical Problem

As a result of repeated intensive research and experiments, the present inventors have found that the dielectric constant and the insulation resistance of the dielectric sheet layer constituting the suppressor and the capacitor, and the electrode structure of the suppressor affect the electrostatic response speed and have come to complete the present invention.

That is, it was learned through repeated research and experiments that, when the dielectric constant of the suppressor is greater than the dielectric constant of the capacitor by a certain ratio or more, the electrostatic response speed by the suppressor is rapidly improved while maintaining the communication characteristics in the wireless communication band.

The present invention has been devised in view of the above points, and is directed to providing a complex device that is suitable for wireless communication and has a fast electrostatic response speed by integrating the static electricity protection function and the capacitor function into a single package with different materials.

Technical Solution

Various aspects of the present invention are directed to providing a complex device, comprising: a suppressor including a pair of first dielectric sheet layers having a first dielectric constant and a pair of internal electrodes spaced apart from each other on one surface of one of the pair of first dielectric sheet layers; a capacitor including a plurality of second dielectric sheet layers having a second dielectric constant and a plurality of capacitor electrodes provided on each of the plurality of second dielectric sheet layers; and a pair of external terminals provided on both sides of the suppressor and the capacitor to be connected to the plurality of capacitor electrodes and the pair of internal electrodes, wherein the first dielectric constant is greater than the second dielectric constant.

According to a preferred embodiment of the present invention, the pair of internal electrodes may be spaced apart from each other by a first interval in the width direction of the first dielectric sheet layer, and may overlap by a first length in the longitudinal direction of the first dielectric sheet layer.

In addition, each of the pair of internal electrodes may be connected to a different external terminal among the pair of external terminals, and may have a length greater than half the length of the first dielectric sheet layer.

In this case, the first interval may be 18 to 26 $\mu m$. In addition, the first length may be 140 to 180 $\mu m$.

In addition, the ratio of the first dielectric constant to the second dielectric constant may be 8 to 12.

In addition, the first dielectric sheet layer may have a lower insulation resistance than the second dielectric sheet layer.

In addition, the suppressor and the capacitor may be stacked in a green sheet state and co-fired.

In addition, the suppressor may have a discharge inception voltage of 6 kV or less due to static electricity.

In addition, the capacitor may be provided on at least one side of the upper side and lower side of the suppressor.

Advantageous Effects

According to the present invention, by constructing the present invention with a different material in which the dielectric constant of the suppressor is greater than the dielectric constant of the capacitor, the response speed to static electricity can be rapidly improved while maintaining the frequency characteristic, thereby improving the reliability of the product.

In addition, the present invention can satisfy the needs of customers because stable performance can be ensured for both the communication signal transmission function and the static electricity protection function in the portable electronic apparatus by improving the electrostatic response speed while maintaining the frequency characteristic.

In addition, the present invention can simplify the manufacturing process by co-firing the suppressor and the capacitor of different materials, thereby improving manufacturing efficiency and reducing manufacturing cost, thereby increasing product price competitiveness.

BRIEF DESCRIPTION OF THE DRAWINGS

The above and other aspects, features, and advantages of the present invention will become more apparent to those of ordinary skill in the art by describing embodiments thereof in detail with reference to the accompanying drawings, in which.

DETAILED DESCRIPTION OF THE EMBODIMENTS

Hereinafter, exemplary embodiments of the present invention will be described in detail so that those of ordinary skill in the art can readily implement the present invention with reference to the accompanying drawings. The present invention may be embodied in many different forms and is not limited to the embodiments set forth herein. In the drawings, parts unrelated to the description are omitted for clarity of description of the present invention. Throughout the specification, like reference numerals denote like elements.

Figure 1:
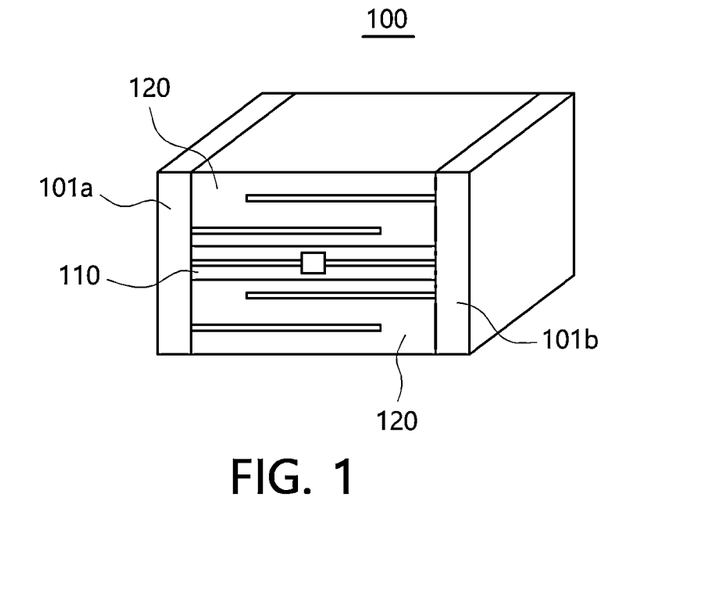
FIG. 1 is a perspective view showing a complex device according to an exemplary embodiment of the present invention.
Figure 2:
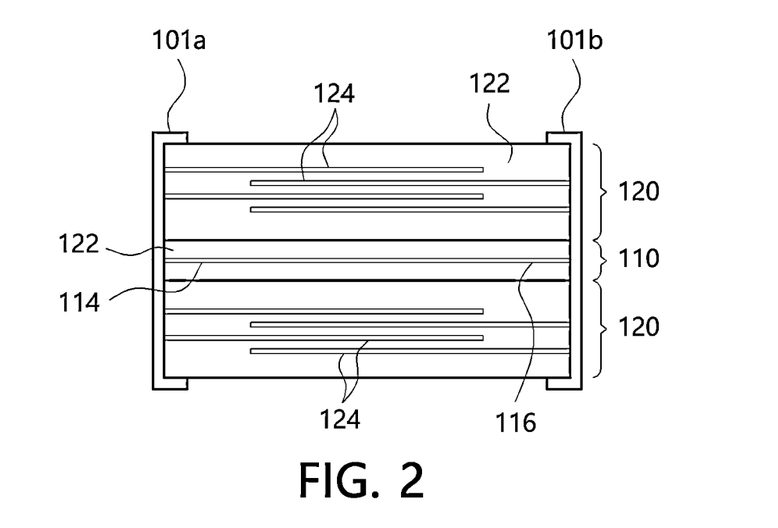
FIG. 2 is a cross-sectional view of FIG. 1.
Figure 3:
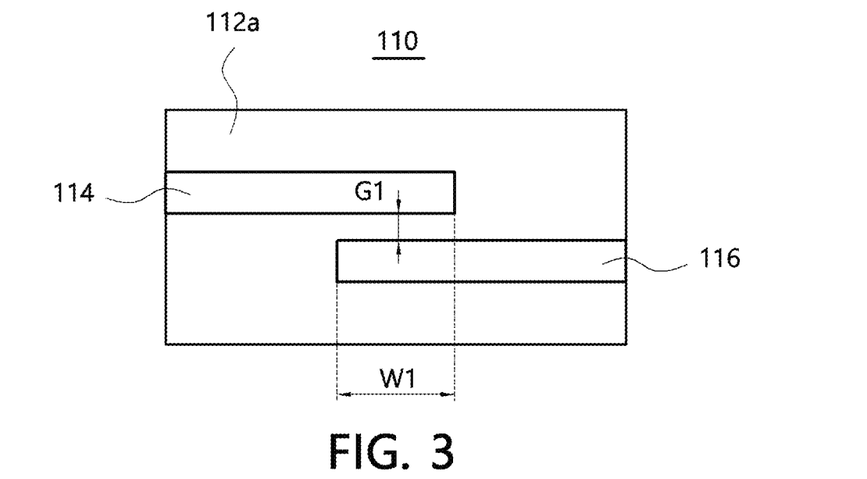
FIG. 3 is a top plan view of the suppressor in FIG. 1.

As shown in FIGS. 1 to 3, a complex device 100 according to an embodiment of the present invention includes external terminals 101a and 101b, a suppressor 110, and a capacitor 120.

The complex device 100 has the suppressor 110 and the capacitor 120 each made of different materials, and can simultaneously satisfy the fast electrostatic response speed by the suppressor 110 and the stable characteristics of the communication signal transmission function by the capacitor 120.

Here, the suppressor 110 and the capacitor 120 are stacked on each other, and the capacitor 120 may be provided on at least one side of the upper side and lower side of the suppressor 110. For example, as shown in FIG. 2, the capacitor 120 may be provided on both the upper side and lower side of the suppressor 110.

In this case, the suppressor 110 and the capacitor 120 may be stacked in a green sheet state and co-fired to implement the one-chip complex device 100. Accordingly, since the suppressor 110 and the capacitor 120 are implemented using different materials and only a single firing process is used, the manufacturing process can be simplified. Therefore, it is possible to improve the manufacturing efficiency by simplifying the manufacturing process and at the same time reduce the manufacturing cost. As a result, the price competitiveness of the product can be improved.

External terminals 101a and 101b are provided on opposite sides of the suppressor 110 and the capacitor 120. Here, the external terminals 101a and 101b are connected to a pair of internal electrodes 114 and 116 and a plurality of capacitor electrodes 124. For example, the external terminal 101a may be connected to the internal electrode 114 and the capacitor electrode 124. In addition, the external terminal 101b may be connected to the internal electrode 116 and the capacitor electrode 124.

The external terminals 101a and 101b are electrodes for electrically connecting the suppressor 110 and the capacitor 120 in parallel and at the same time soldering the complex device 100 to a circuit board, and may have a "⊏" shape in cross-section.

Accordingly, the suppressor 110 and the capacitor 120 may selectively operate with respect to static electricity, leakage current of an external power source, and communication signal, so that the complex device 100 may perform all of a static electricity protection function, an electric shock prevention function, and a communication signal transmission function.

The suppressor 110 performs a static electricity protection function and an electric shock prevention function. Here, the suppressor 110 includes a first dielectric sheet layer 112 and internal electrodes 114 and 116.

The first dielectric sheet layer 112 includes a dielectric having a first dielectric constant. For example, the first dielectric sheet layer 112 may be formed of a "K1000" product group. Here, the first dielectric sheet layer 112 may be formed in a pair on upper and lower portions with respect to the internal electrodes 114 and 116.

The internal electrodes 114 and 116 are provided on one surface of any one 112a of the pair of first dielectric sheet layers 112. In this case, the internal electrodes 114 and 116 may be provided on surfaces of the pair of first dielectric sheet layers 112 facing each other. That is, the internal electrodes 114 and 116 may be provided to be disposed between the pair of first dielectric sheet layers 112. In other words, the internal electrodes 114 and 116 may be provided on the same plane in the first dielectric sheet layer 112a (see FIG. 3).

In addition, the internal electrodes 114 and 116 are formed as a pair. In this case, the internal electrodes 114 and 116 are provided to be spaced apart from each other. Here, the internal electrodes 114 and 116 may be formed of "number 11" shape. Referring to FIG. 3, the pair of internal electrodes 114 and 116 may be spaced apart from each other by a first interval G1 in the width direction of the first dielectric sheet layer 112. In addition, the pair of internal electrodes 114 and 116 may overlap by a first length W1 in the longitudinal direction of the first dielectric sheet layer 112.

In other words, each of the pair of internal electrodes 114 and 116 may be formed to extend from opposite sides of the first dielectric sheet layer 112a to be connected to a different external terminal among the pair of external terminals 101a and 101b. In this case, the pair of internal electrodes 114 and 116 may have a length greater than half the length of the first dielectric sheet layer 112a. That is, the pair of internal electrodes 114 and 116 extending from opposite sides of the first dielectric sheet layer 112 may overlap by the first length W1.

The first interval G1 may be 18 to 26 μm. Here, if the first interval G1 is smaller than 18 μm, resistance to static electricity may be weakened. In addition, if the first interval G1 is greater than 26 μm, the discharge inception voltage (operating voltage) increases, so that a smooth discharge by static electricity is not performed, so that the effect of improving the response speed does not appear.

The first length W1 may be 140 to 180 μm. Here, if the first length W1 is smaller than 140 μm, the discharge inception voltage (operating voltage) increases, so that a smooth discharge by static electricity is not performed, so that the effect of improving the response speed does not appear. In addition, if the first length W1 is greater than 180 μm, the capacitance of the suppressor 110 increases to increase the total capacitance of the complex device 100. Therefore, it adversely affects the communication signal transmission function in the high frequency band.

In addition, the suppressor 110 may have a discharge inception voltage of 6 kV or less. Here, if the discharge inception voltage exceeds 6 kV, the response speed to static electricity is the same as when it is composed of the same material with the same dielectric constant. Therefore, the effect of improving the electrostatic response speed does not appear.

The capacitor 120 performs a communication signal transmission function. Here, the capacitor 120 includes a second dielectric sheet layer 122 and a capacitor electrode 124.

The second dielectric sheet layer 122 includes a dielectric having a second dielectric constant. For example, the second dielectric sheet layer 122 may be formed of a "K100" product group. Here, the second dielectric sheet layer 122 may be formed in plurality.

The capacitor electrode 124 is provided on each of the plurality of second dielectric sheet layers 122. That is, the capacitor 120 may include a plurality of capacitor electrodes 124. In this case, the second dielectric sheet layers 122 in which the capacitor electrodes 124 are respectively provided at positions symmetrical to each other may be alternately stacked.

For example, the odd-numbered second dielectric sheet layer 122 may be formed to extend from the left to the center so that the capacitor electrode 124 is connected to the external terminal 101a. In addition, the even-numbered second dielectric sheet layer 122 may be formed to extend from the right to the center so that the capacitor electrode 124 is connected to the external terminal 101b.

In this case, the first dielectric constant is greater than the second dielectric constant. For example, the ratio of the first dielectric constant to the second dielectric constant may be 8 to 12. Here, if the ratio of the first dielectric constant to the second dielectric constant is less than 8, the response speed to static electricity is the same as when it is composed of the same material with the same dielectric constant. Therefore, the effect of improving the electrostatic response speed does not appear.

In addition, if the ratio of the first dielectric constant to the second dielectric constant is greater than 12, the capacitance of the suppressor 110 increases to increase the total capacitance of the complex device 100. Therefore, it adversely affects the communication signal transmission function in the high frequency band.

In addition, the first dielectric sheet layer 112 may have a lower insulation resistance than the second dielectric sheet layer 122. That is, the first dielectric sheet layer 112 may have lower insulating properties than the second dielectric sheet layer 122.

Here, if the insulation resistance of the first dielectric sheet layer 112 is greater than that of the second dielectric sheet layer 122, the response speed to static electricity is the same as when the insulation resistance is the same. Therefore, there is no improvement in response speed to static electricity. In addition, there is a possibility that the operation of the capacitor 120 takes precedence over the suppressor 110 when static electricity is introduced, so that there is a risk of damage to the complex device 100 due to the passage of static electricity through the capacitor 120.

Accordingly, while maintaining the frequency characteristics of the wireless communication band by the capacitor 120, it is possible to rapidly improve the response speed to static electricity by the suppressor 110. Therefore, both the communication signal transmission function and the static electricity protection function can be satisfied with high reliability, so the reliability of the product can be improved.

Moreover, since stable performance can be ensured for both the communication signal transmission function and the static electricity protection function in the portable electronic apparatus, it is possible to satisfy the needs of customers who want to simplify the process by reducing the types of parts.

Figure 4:
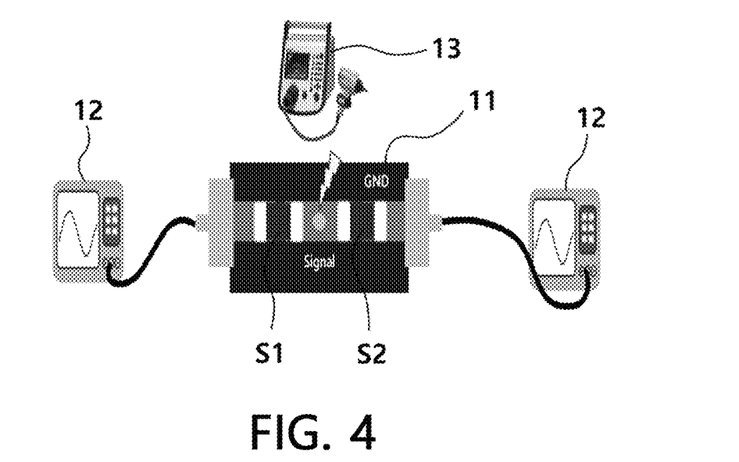
FIG. 4 is a configuration diagram showing an apparatus for testing the electrostatic response speed of a complex device according to an exemplary embodiment of the present invention.

Referring to FIG. 4, an apparatus for measuring the response speed of static electricity may include a test board 11, a waveform measuring instrument 12, and a static electricity simulator 13.

The test board 11 is for applying simulated static electricity by placing two samples S1 and S2. The central portion is a portion to which static electricity is applied, and may be arranged such that the two samples S1 and S2 are respectively connected. Waveform measuring instruments 12 may be connected to opposite sides of the test board 11, respectively.

Here, the waveform measuring instrument 12 is an oscilloscope, and ROHDE & SCHWARZ RTO 1022 was used. The static electricity simulator 13 is one for generating simulated static electricity, and NOISE KEN ESS-S3011 was used.

In this configuration, it was tested which of the samples S1 and S2 responds faster according to the results of the waveform measuring instrument 12 measured from opposite sides of the test board 11 when simulated static electricity is applied by the static electricity simulator 13 to the center of the test board 11 on which the samples S1 and S2 are installed. In this case, each experiment was performed on 300 samples.

First, a response speed test was performed for each of the complex device 100 according to the present embodiment and Comparative Examples 1 and 2 having different dielectric constants.

Here, Comparative Examples 1 and 2 were configured such that the dielectric constant of the suppressor was smaller than that of the complex device 100. Comparative Example 1 was configured such that the first dielectric sheet layer of the suppressor was a "K100" product group. Comparative Example 2 was configured such that the first dielectric sheet layer of the suppressor was a "L40" product group. In this case, Comparative Example 1 was configured such that the ratio of the dielectric constant to Embodiment was 10, and Comparative Example 2 was configured such that the ratio of the dielectric constant to Embodiment was 25.

Figure 5:
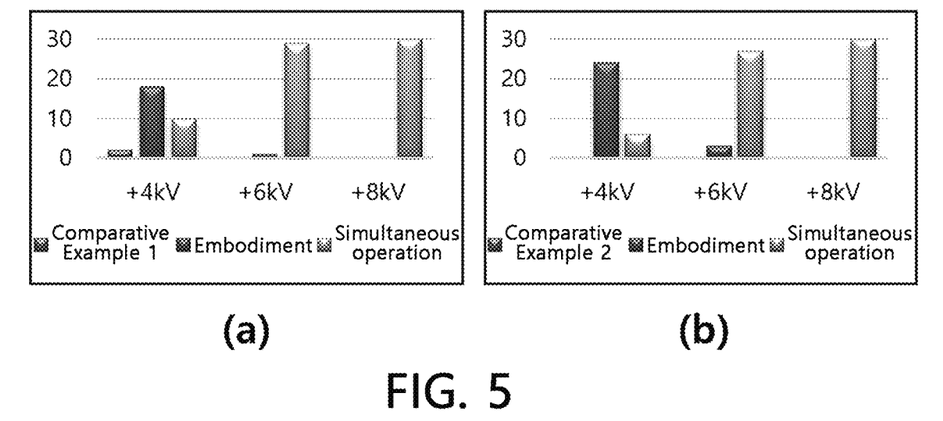
FIG. 5 is a graph showing the electrostatic response speed test results of Comparative Examples 1 and 2 having different dielectric constants from a complex device according to an exemplary embodiment of the present invention, wherein (a) is a graph showing the experimental results of Embodiment and Comparative Example 1 and (b) is a graph showing the experimental results of Embodiment and Comparative Example 2.

Referring to FIG. 5, when the static electricity applied voltage was 8 kV, Embodiment operated simultaneously with both Comparative Examples 1 and 2. This indicates that the effect of improving the response speed does not appear. When the static electricity applied voltage was 6 kV, Embodiment operated simultaneously with Comparative Example 1 and generally simultaneously operated with Comparative Example 2, but in some cases, Embodiment responded faster. In addition, when the static electricity applied voltage was 4 kV, Embodiment responded faster than both Comparative Examples 1 and 2 in many cases.

As can be seen from this, the complex device 100 according to an embodiment of the present invention exhibited an effect of improving the response speed when the operating voltage (discharge inception voltage) is 6 kV or less, preferably 4 kV or less. In addition, when the suppressor 110 and the capacitor 120 are made of different materials and the dielectric constant of the suppressor 110 is greater than that of the capacitor 120, the effect of improving the response speed was shown.

Second, a response speed test was performed for each of the complex device 100 according to the present embodiment and Comparative Examples 3 and 4 having different structure of internal electrode.

Figure 6:
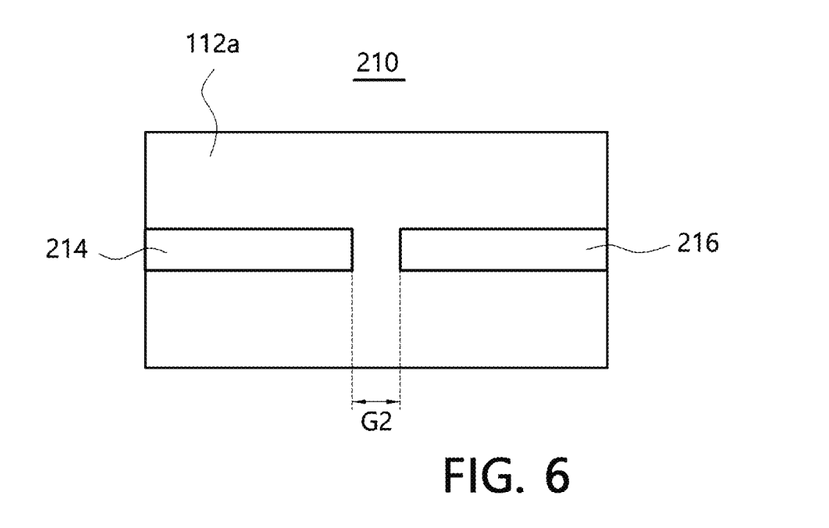
FIG. 6 is a top plan view showing a configuration of a suppressor electrode of Comparative Example 3 for the experiment of FIG. 5.
Figure 7:
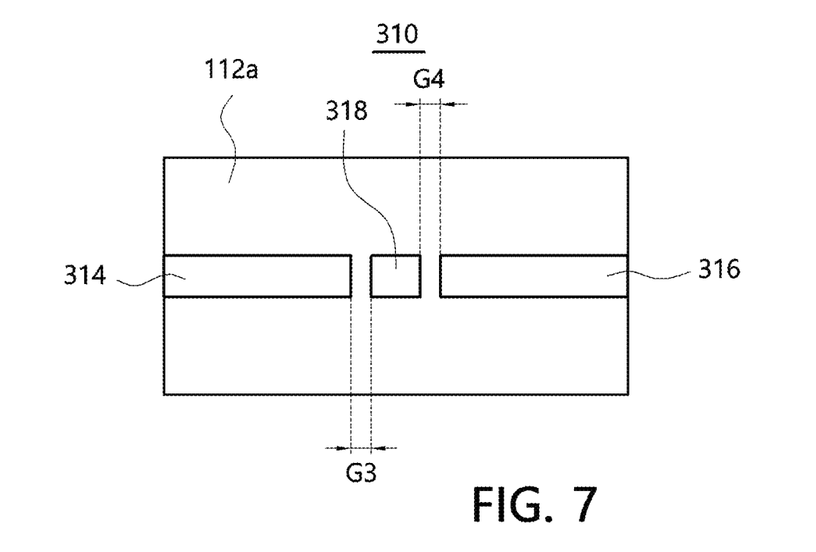
FIG. 7 is a top plan view showing a configuration of a suppressor electrode of Comparative Example 4 for the experiment of FIG. 5.

Here, as shown in FIG. 6, the Comparative Example 3 was configured such that the internal electrodes 214 and 216 of the suppressor were formed in a straight line and the center had a second interval G2. Here, the second interval G2 was configured to be the same as the first interval G1. As shown in FIG. 7, Comparative Example 2 was configured such that the internal electrodes 314, 316, and 318 of the suppressor were formed in a straight line, but one 318 of the internal electrodes was isolated. Here, a third interval G3 and a fourth interval G4 between the internal electrodes 314, 316, and 318 were configured to be the same as the first interval G1.

Figure 8:
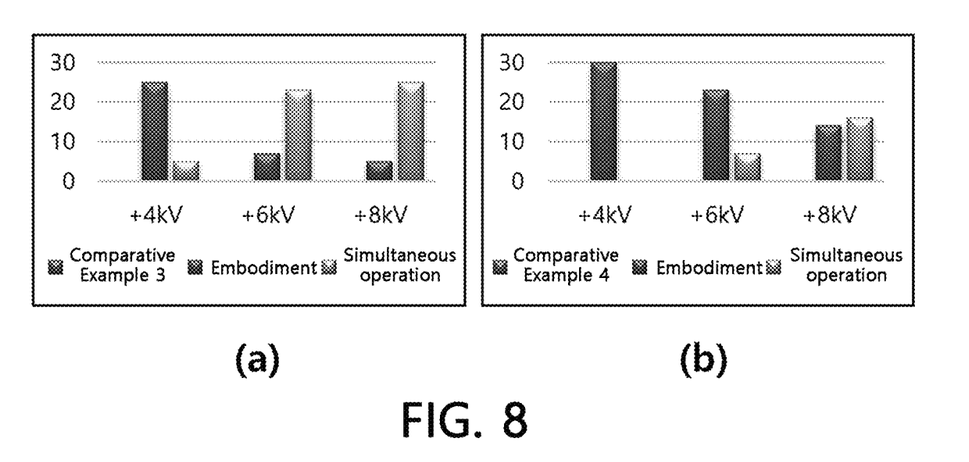
FIG. 8 is a graph showing the electrostatic response speed test results of Comparative Examples 3 and 4 having different electrode configurations from a complex device according to an exemplary embodiment of the present invention, wherein (a) is a graph showing the experimental results of Embodiment and Comparative Example 3 and (b) is a graph showing the experimental results of Embodiment and Comparative Example 4.

Referring to FIG. 8, when the static electricity applied voltage was 4 kV, Embodiment responded faster than Comparative Examples 3 and 4. In addition, when the static electricity applied voltage was 6 kV and 8 kV, Embodiment responded faster than Comparative Example 3 and Comparative Example 4 in some cases.

As can be seen from this, the complex device 100 according to an embodiment of the present invention exhibited an effect of improving the response speed when the internal electrode was configured in a "number 11" shape.

Third, electrical characteristics test and response speed test were performed for each of the complex device 100 according to the present embodiment and Comparative Examples 5 and 6, which are conventional products based on the same material.

Here, Comparative Examples 5 and 6 were configured such that the suppressor and the capacitor were made of the same material, but Comparative Example 5 used the same "K1000" product as the dielectric constant of the suppressor 110 of Embodiment and Comparative Example 6 used a COG-based dielectric that was stable in temperature characteristics and RF performance. In addition, Comparative Examples 5 and 6 were configured such that the internal electrodes vertically face each other. In Comparative Example 5, Amotech's "HESP 02 100JS1" product was used, and in Comparative Example 6, Amotech's "HESP 02 100JTC" product was used.

Figure 9:
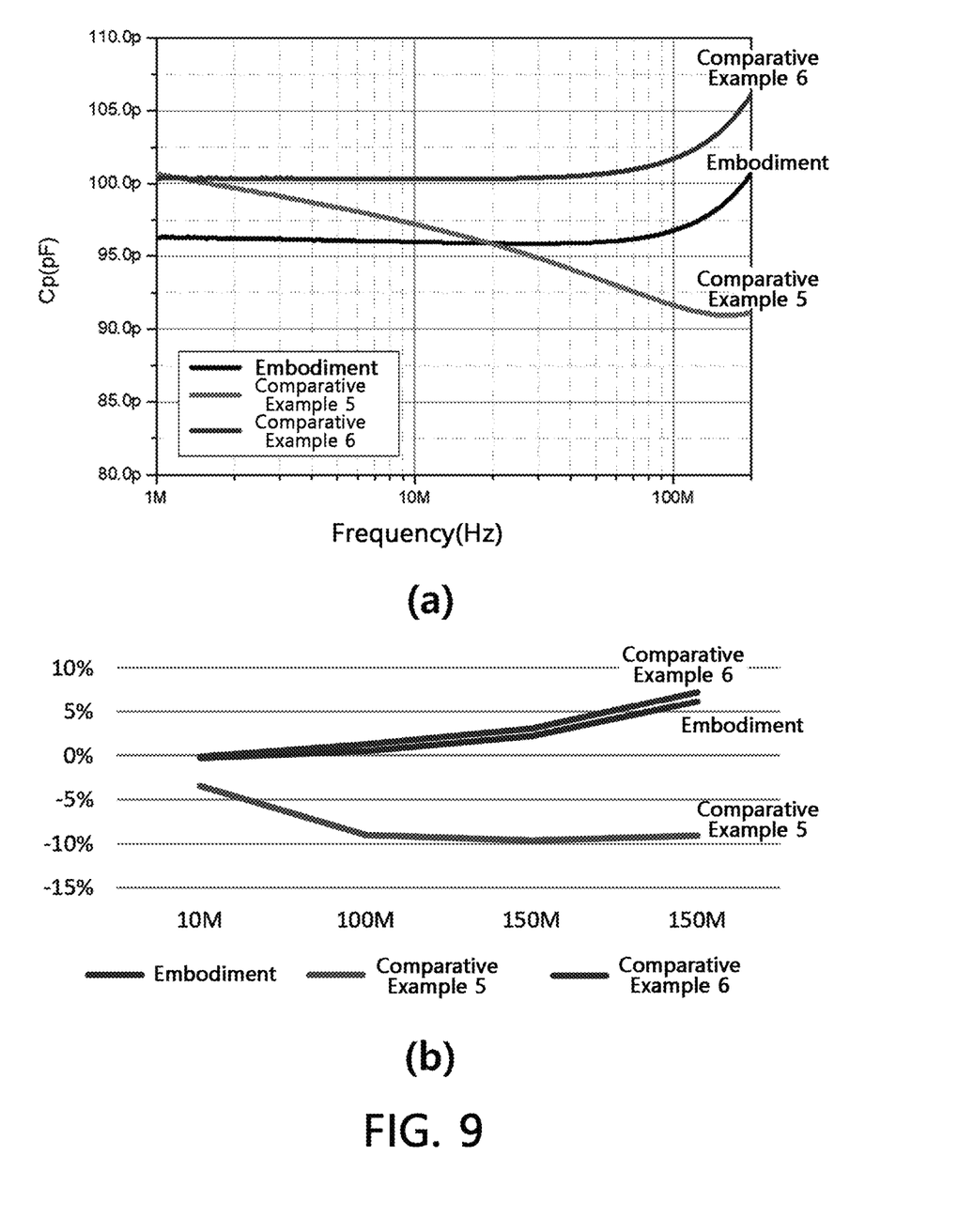
FIG. 9 is a graph showing the capacitance characteristics of a complex device according to an exemplary embodiment of the present invention and Comparative Examples 5 and 6, which are conventional mass-produced products, wherein (a) is a graph showing the frequency vs. capacitance characteristic and (b) is a graph showing the rate of change of the frequency vs. capacitance.

Referring to FIG. 9, compared to Comparative Example 5, Embodiment had a lower capacitance at a relatively low frequency, had a higher capacitance at a high frequency, and was excellent in the rate of change of capacitance by frequency. In addition, compared to Comparative Example 6, Embodiment had a lower capacitance by frequency, and was similar in the rate of change of capacitance by frequency.

As can be seen from this, the complex device 100 according to an embodiment of the present invention exhibited capacitance characteristics by frequency similar to Comparative Example 6 of COG-based, and exhibited superior electrical properties than Comparative Example 5 of K1000.

Figure 10:
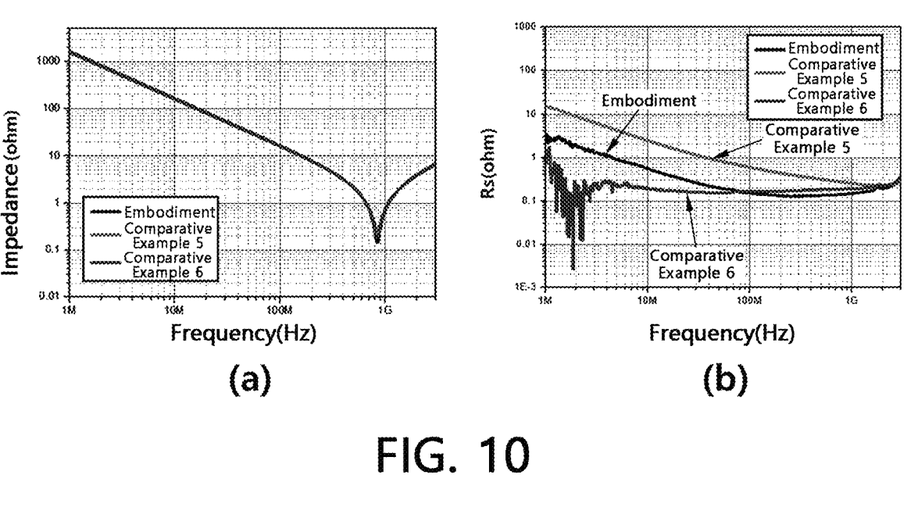
FIG. 10 is a graph showing the impedance characteristics of a complex device according to an exemplary embodiment of the present invention and Comparative Examples 5 and 6, wherein (a) is a graph showing the frequency vs. impedance characteristic and (b) is a graph showing the frequency vs equivalent series resistance (ESR) characteristics.

Referring to FIG. 10, Embodiment had impedance characteristics by frequency similar to Comparative Example 5 and 6. In addition, Embodiment exhibited equivalent series resistance (ESR) characteristics by frequency smaller or similar to Comparative Example 5. In addition, Embodiment showed higher equivalent series resistance (ESR) characteristics by frequency in a lower frequency band than Comparative Example 6, but showed similar characteristics in a band of 100 MHz or higher.

As can be seen from this, in a band of 100 MHz or higher, the complex device 100 according to an embodiment of the present invention exhibited impedance and equivalent series resistance (ESR) characteristics by frequency similar to Comparative Example 6 of COG-based, and exhibited superior electrical properties than Comparative Example 5 of K1000.

Figure 11:
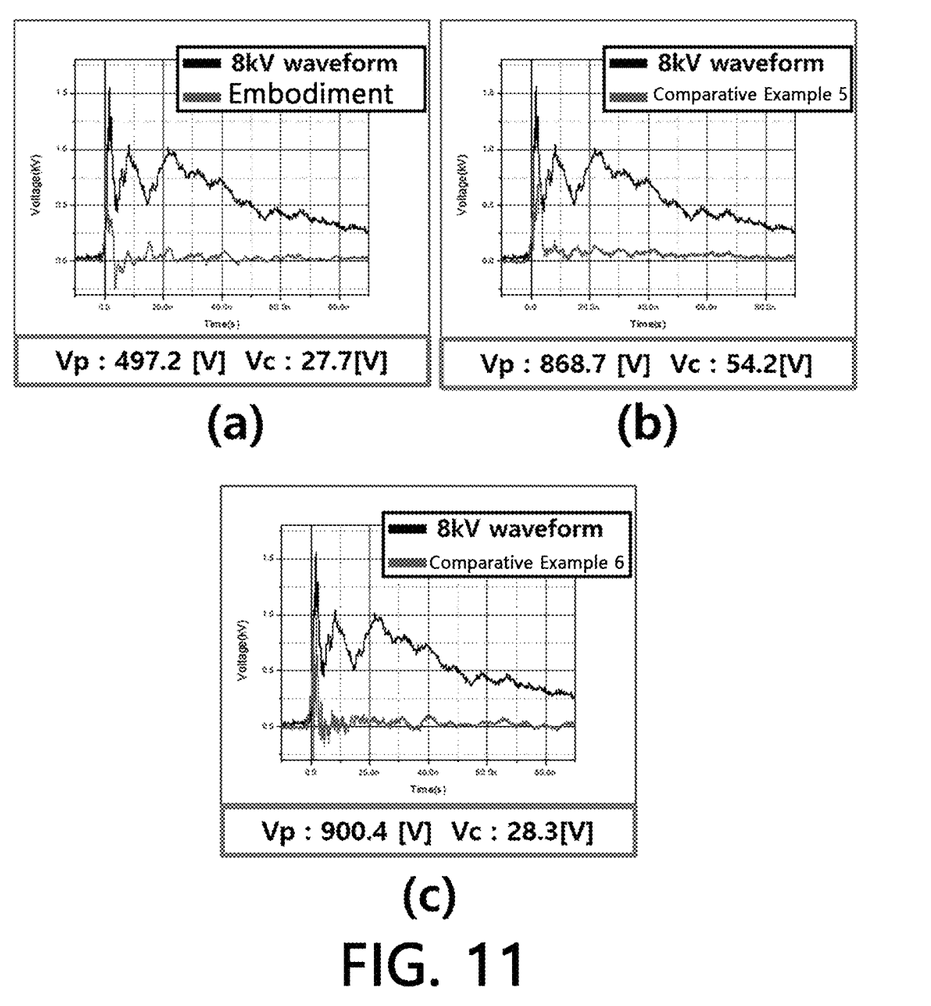
FIG. 11 is a graph showing the electrostatic characteristics of a complex device according to an exemplary embodiment of the present invention and Comparative Examples 5 and 6, wherein (a) is a graph showing Embodiment, (b) is a graph showing Comparative Example 5, and (c) is a graph showing Comparative Example 6.

Referring to FIG. 11, Embodiment exhibited electrostatic resistance characteristics similar to Comparative Example 5, and exhibited superior electrostatic resistance characteristics than Comparative Example 6. In addition, due to the difference in the internal electrode structure, the peak voltage Vp and the clamping voltage Vc of Embodiment were lower than those of Comparative Example 5.

As can be seen from this, the complex device 100 according to an embodiment of the present invention exhibited the same electrostatic resistance as Comparative Example 5 of K1000, but exhibited superior results in the peak voltage Vp and the clamping voltage Vc. In addition, the complex device 100 according to an embodiment of the present invention exhibited superior electrostatic resistance than Comparative Example 6 of COG-based.

Figure 12:
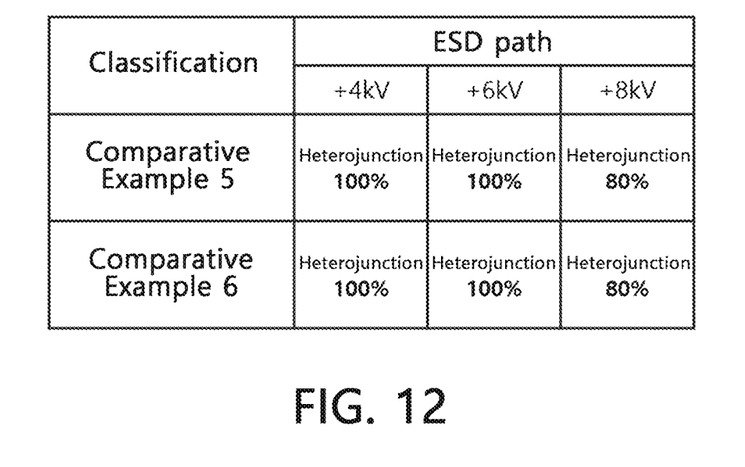
FIG. 12 is a view showing the electrostatic response speed test results of a complex device according to an exemplary embodiment of the present invention and Comparative Examples 5 and 6.

Referring to FIG. 12, when the static electricity applied voltage was 4 kV and 6 kV, Embodiment responded faster than both Comparative Examples 5 and 6. In addition, even when the static electricity applied voltage was 8 kV, Embodiment responded more quickly than Comparative Examples 5 and 6 in most cases.

As can be seen from this, the complex device 100 according to an embodiment of the present invention exhibited an effect of improving the response speed compared to the case of using the same material such as COG or K1000.

As a result, the complex device 100 according to an embodiment of the present invention exhibited superior electrical properties and response speed improvement effect at the same time compared to conventional mass-produced products using the same material of COG-based or "K1000".

Although exemplary embodiments of the present invention have been described above, the spirit of the present invention is not limited to the embodiments set forth herein. Those of ordinary skill in the art who understand the spirit of the present invention may easily propose other embodiments through supplement, change, removal, addition, etc. of elements within the same spirit, but the embodiments will be also within the scope of the present invention.

What is claimed is:

1. A complex device, comprising:
   a suppressor comprising a pair of first dielectric sheet layers having a first dielectric constant and a pair of internal electrodes spaced apart from each other on one surface of one of the pair of first dielectric sheet layers;
   a capacitor comprising a plurality of second dielectric sheet layers having a second dielectric constant and a plurality of capacitor electrodes provided on each of the plurality of second dielectric sheet layers; and
   a pair of external terminals provided on both sides of the suppressor and the capacitor to be connected to the plurality of capacitor electrodes and the pair of internal electrodes,
   wherein the first dielectric constant is greater than the second dielectric constant, and
   wherein the pair of internal electrodes are spaced apart from each other by a first interval in the width direction of the first dielectric sheet layer, and overlap by a first length in the longitudinal direction of the first dielectric sheet layer.

2. A complex device, comprising:
   a suppressor comprising a pair of first dielectric sheet layers having a first dielectric constant and a pair of internal electrodes spaced apart from each other on one surface of one of the pair of first dielectric sheet layers;
   a capacitor comprising a plurality of second dielectric sheet layers having a second dielectric constant and a plurality of capacitor electrodes provided on each of the plurality of second dielectric sheet layers; and
   a pair of external terminals provided on both sides of the suppressor and the capacitor to be connected to the plurality of capacitor electrodes and the pair of internal electrodes,
   wherein the first dielectric constant is greater than the second dielectric constant, and
   wherein each of the pair of internal electrodes is connected to a different external terminal among the pair of external terminals, and has a length greater than half the length of the first dielectric sheet layer.

3. The complex device of claim 1, wherein the first interval is 18 to 26 µm.

4. The complex device of claim 1, wherein the first length is 140 to 180 µm.

5. A complex device, comprising:
   a suppressor comprising a pair of first dielectric sheet layers having a first dielectric constant and a pair of internal electrodes spaced apart from each other on one surface of one of the pair of first dielectric sheet layers;
   a capacitor comprising a plurality of second dielectric sheet layers having a second dielectric constant and a plurality of capacitor electrodes provided on each of the plurality of second dielectric sheet layers; and
   a pair of external terminals provided on both sides of the suppressor and the capacitor to be connected to the plurality of capacitor electrodes and the pair of internal electrodes,
   wherein the first dielectric constant is greater than the second dielectric constant, and
   wherein the ratio of the first dielectric constant to the second dielectric constant is 8 to 12.

6. The complex device of claim 1, wherein the first dielectric sheet layer has a lower insulation resistance than the second dielectric sheet layer.

7. The complex device of claim 1, wherein the suppressor and the capacitor are stacked in a green sheet state and co-fired.

8. The complex device of claim 1, wherein the suppressor has a discharge inception voltage of 6 kV or less due to static electricity.

9. The complex device of claim 1, wherein the capacitor is provided on at least one side of the upper side and lower side of the suppressor.

* * * * *